United States Patent
Lee et al.

(10) Patent No.: US 10,672,800 B2
(45) Date of Patent: Jun. 2, 2020

(54) DISPLAY PANEL WITH NON-DISPLAY AREA LINES AND DISPLAY DEVICE INCLUDING THE SAME

(71) Applicant: LG Display Co., Ltd., Seoul (KR)

(72) Inventors: Hyun Haeng Lee, Paju-si (KR); Dae Woong Chun, Seoul (KR)

(73) Assignee: LG Display Co., Ltd., Seoul (KR)

( * ) Notice: Subject to any disclaimer, the term of this patent is extended or adjusted under 35 U.S.C. 154(b) by 48 days.

(21) Appl. No.: 15/691,264

(22) Filed: Aug. 30, 2017

(65) Prior Publication Data

US 2018/0061858 A1 Mar. 1, 2018

(30) Foreign Application Priority Data

Aug. 31, 2016 (KR) ........................ 10-2016-0111382

(51) Int. Cl.
| | |
|---|---|
| *H01L 27/12* | (2006.01) |
| *G02F 1/1368* | (2006.01) |
| *G02F 1/1333* | (2006.01) |
| *G02F 1/1362* | (2006.01) |
| *G02F 1/1343* | (2006.01) |
| *G02F 1/1345* | (2006.01) |
| *H01L 27/32* | (2006.01) |
| *G09G 3/20* | (2006.01) |
| *G09G 3/3225* | (2016.01) |
| *G09G 3/3266* | (2016.01) |

(Continued)

(52) U.S. Cl.
CPC .......... *H01L 27/124* (2013.01); *G02F 1/1368* (2013.01); *G02F 1/13452* (2013.01); *G02F 1/133345* (2013.01); *G02F 1/134309* (2013.01); *G02F 1/136209* (2013.01); *G02F 1/136286* (2013.01); *H01L 27/3276* (2013.01); *G02F 1/13439* (2013.01); *G09G 3/20* (2013.01); *G09G 3/3225* (2013.01); *G09G 3/3266* (2013.01); *G09G 3/3275* (2013.01); *G09G 3/3677* (2013.01); *G09G 3/3688* (2013.01); *G09G 2300/0426* (2013.01); *H01L 27/3272* (2013.01); *H01L 27/3279* (2013.01); *H01L 29/78633* (2013.01)

(58) Field of Classification Search
CPC ............. H01L 27/124; H01L 27/33279; H01L 29/78633; H01L 27/3272; G02F 1/1368; G02F 1/136286; G02F 1/136209; G02F 1/13452; G02F 1/134309; G02F 1/133345; G02F 1/13439; G09G 3/20; G09G 2300/0426; G09G 3/3688; G09G 3/3677; G09G 3/3275; G09G 3/3266; G09G 3/3225

See application file for complete search history.

(56) References Cited

U.S. PATENT DOCUMENTS

| | | | | |
|---|---|---|---|---|
| 2003/0227078 A1* | 12/2003 | Chang | .................... | G02F 1/1345 257/693 |
| 2008/0129944 A1* | 6/2008 | Park | ...................... | G02F 1/1345 349/150 |

(Continued)

*Primary Examiner* — Kwang-Su Yang
(74) *Attorney, Agent, or Firm* — Polsinelli PC

(57) ABSTRACT

Disclosed are a display panel and a display device including the same, in which each of non-display area lines, provided in an outer side among a plurality of non-display area lines connecting a driving driver to a plurality of display area lines provided in a display area, includes two electrodes electrically connected to each other with an insulation layer therebetween.

8 Claims, 5 Drawing Sheets

(51) Int. Cl.
  *G09G 3/3275* (2016.01)
  *G09G 3/36* (2006.01)
  *H01L 29/786* (2006.01)

(56) References Cited

U.S. PATENT DOCUMENTS

2015/0138466 A1* 5/2015 Mori .................... G11C 19/287
  349/38
2016/0358939 A1* 12/2016 Lee ....................... H01L 27/124

* cited by examiner

DISPLAY PANEL WITH NON-DISPLAY AREA LINES AND DISPLAY DEVICE INCLUDING THE SAME

CROSS-REFERENCE TO RELATED APPLICATIONS

This application claims the benefit of the Korean Patent Application No. 10-2016-0111382 filed on Aug. 31, 2016, which is hereby incorporated by reference in its entirety as if fully set forth herein.

BACKGROUND

Field of the Disclosure

The present disclosure relates to a display device, and more particularly, to a display panel and a display device including the same, which include a plurality of non-display areas for connecting a driving driver to a plurality of display area lines provided in a display area.

Description of the Background

Flat panel display (FPD) devices have been applied to various kinds of electronic devices such as portable phones, tablet personal computers (PCs), notebook computers, etc. Examples of the FPD devices include liquid crystal display (LCD) devices, plasma display panels (PDPs), organic light emitting display devices, etc. Also, electrophoretic display (EPD) devices have been recently used as one type of the FPD device.

Among such display devices, the LCD devices have been the most widely commercialized because the LCD devices can easily be manufactured due to the advance of manufacturing technology and realization of a drivability of a driver and a high-quality image.

Among such display devices, the organic light emitting display devices have a fast response time of 1 ms or less and low power consumption, and thus are attracting much attention as next generation FPD devices.

FIG. 1 is an exemplary diagram illustrating a related art display device.

The related art display device, as illustrated in FIG. 1, includes a display panel 10, which includes a display area 11 displaying an image and a non-display area 12 provided outside the display area 11, and a driving driver 30 that drives the display panel 10.

A plurality of non-display area lines 21 connected to the driving driver 30 are provided in the non-display area 12, and a plurality of display area lines connected to the non-display area lines are provided in the display area 11. The plurality of display area lines are a plurality of gate lines and a plurality of data lines.

The non-display area lines 21, as illustrated in FIG. 1, are inclined to the left direction or the right direction with respect to the non-display area line 22 disposed at the center, of the non-display area lines 21.

Therefore, lengths of the non-display area lines 21 differ among one another. For this reason, resistances of the non-display area lines 21 differ as well. For example, since a length of the center non-display area line 21 and lengths of non-display area lines arranged near the center non-display area line 21 are short, a resistance of the center non-display area line 21 and resistances of the non-display area lines arranged near the center non-display area line 21 are low. However, an inclined angle of each of non-display area lines far away from the non-display area line 22 disposed in the central region increases progressively farther away from the center non-display area line 22, and for this reason, resistances of non-display area lines far away from the center non-display area line 22 are high.

Therefore, a smear can occur in an image displayed on the display area 12.

In order to solve such a problem, in the related art, the center non-display area line 211 and non-display area lines arranged near the center non-display area line 21 are designed in a zigzag type.

However, resistances of non-display area lines provided in an outer side among the non-display area lines 21 are far higher than those of non-display area line provided in the center among the non-display area lines 21, and for this reason, due to the zigzag type, it is difficult to decrease a resistance deviation of the non-display area lines 21.

Therefore, in order to minimize such a resistance deviation, a length A between the driving driver 30 and the display area 11 increases.

However, if the length A increases, a width of a bezel of the display panel 12 increases. Therefore, the increase in the length A does not satisfy requirements of consumers which desire to minimize the width of the bezel.

SUMMARY

Accordingly, the present disclosure is directed to provide a display panel and a display device including the same that substantially obviate one or more problems due to limitations and disadvantages of the related art.

An aspect of the present disclosure is directed to provide a display panel and a display device including the same, in which each of non-display area lines, provided in an outer side among a plurality of non-display area lines connecting a driving driver to a plurality of display area lines provided in a display area, includes two electrodes electrically connected to each other with an insulation layer therebetween.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display panel including a display area including a plurality of display area lines through which a data voltage or a gate pulse is supplied and a non-display area provided outside the display area to surround the display area. A pad part, including a plurality of pads connected to a driving driver that supplies the data voltage or the gate pulse, is provided in the non-display area. A plurality of non-display area lines connecting the plurality of pads to the plurality of display area lines are provided in the non-display area. An inclined angle of each of the plurality of non-display area lines increases in a direction from a center non-display area line, disposed in a center of the pad part, of the plurality of non-display area lines to an outer side. The plurality of non-display area lines each includes a plurality of first lines provided in a first area including the center non-display area line, a plurality of second lines arranged outside one side of each of the plurality of first lines, and a plurality of third lines arranged outside another side of each of the plurality of first lines, the plurality of second lines each includes a first electrode and a second electrode electrically connected to each other with an insulation layer therebetween. The plurality of third lines each includes a third electrode and a fourth electrode electrically connected to each other with an insulation layer therebetween.

In another aspect of the present disclosure, there is provided a display device including a display panel including a plurality of display area lines and displaying an image and a driving driver supplying data voltages or a gate pulse to the plurality of display area lines. The display panel includes a display area including the plurality of display area lines and a non-display area provided outside the display area to surround the display area. A pad part, including a plurality of pads connected to the driving driver, is provided in the non-display area. A plurality of non-display area lines connecting the plurality of pads to the plurality of display area lines are provided in the non-display area. An inclined angle of each of the plurality of non-display area lines increases in a direction from a center non-display area line, disposed in a center of the pad part, of the plurality of non-display area lines to an outer side. The plurality of non-display area lines each includes a plurality of first lines provided in a first area including the center non-display area line, a plurality of second lines arranged outside one side of each of the plurality of first lines, and a plurality of third lines arranged outside another side of each of the plurality of first lines, the plurality of second lines each includes a first electrode and a second electrode electrically connected to each other with an insulation layer therebetween. The plurality of third lines each includes a third electrode and a fourth electrode electrically connected to each other with an insulation layer therebetween.

In another aspect of the present disclosure, a display device comprising a display panel including a plurality of display area lines and displaying an image, a non-display area disposed outside and surrounding the display area and a driving driver supplying at least one of data voltages and a gate pulse to the plurality of display area lines includes a pad part comprising a plurality of pads connected to the driving driver and disposed in the non-display area; and a plurality of non-display area lines connecting the plurality of pads to the plurality of display area lines in the non-display area, each of the plurality of non-display area lines having an inclined angle increased to a direction from a center non-display area line, disposed in a center of the pad part to an outer side, wherein each non-display area lines comprises, a plurality of first lines provided in a first area including the center non-display area line, a plurality of second lines arranged outside one side of each of the plurality of first lines; and a plurality of third lines arranged outside another side of each of the plurality of first lines, wherein the plurality of second lines each comprises a first electrode and a second electrode electrically connected to each other with an insulation layer therebetween, and the plurality of third lines each comprise a third electrode and a fourth electrode electrically connected to each other with an insulation layer therebetween.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principle of the disclosure.

In the drawings.

DETAILED DESCRIPTION

Figure 1:
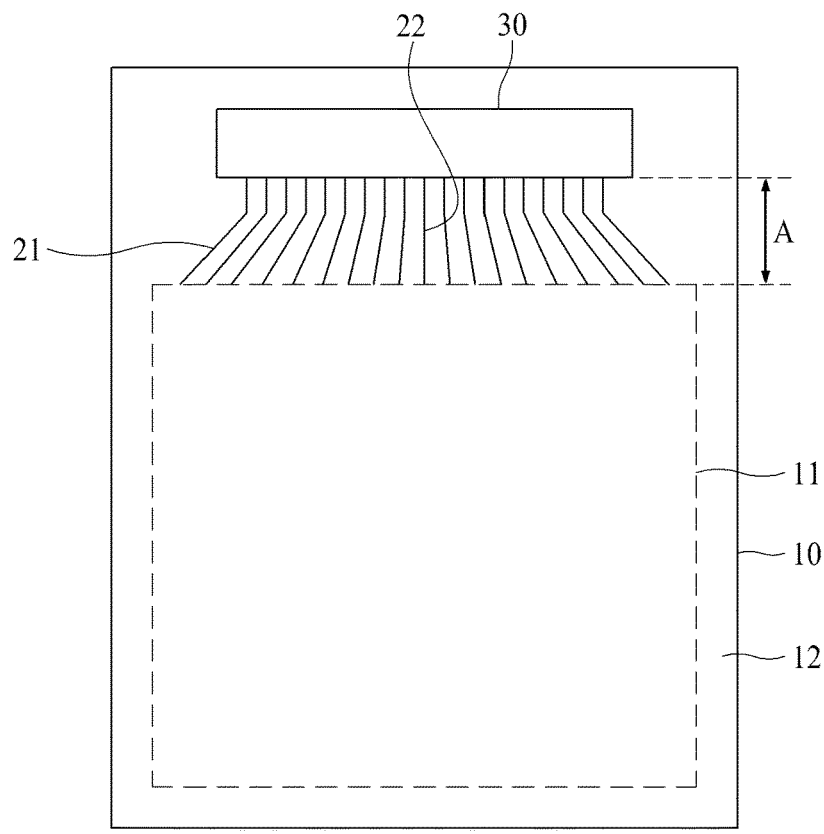
FIG. 1 is an exemplary diagram illustrating a related art display device.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

In the disclosure, in adding reference numerals for elements in each drawing, it should be noted that like reference numerals already used to denote like elements in other drawings are used for elements wherever possible.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of the present disclosure will be described in detail with reference to the accompanying drawings.

The present disclosure may be applied to various kinds of display devices using external compensation.

Figure 2:
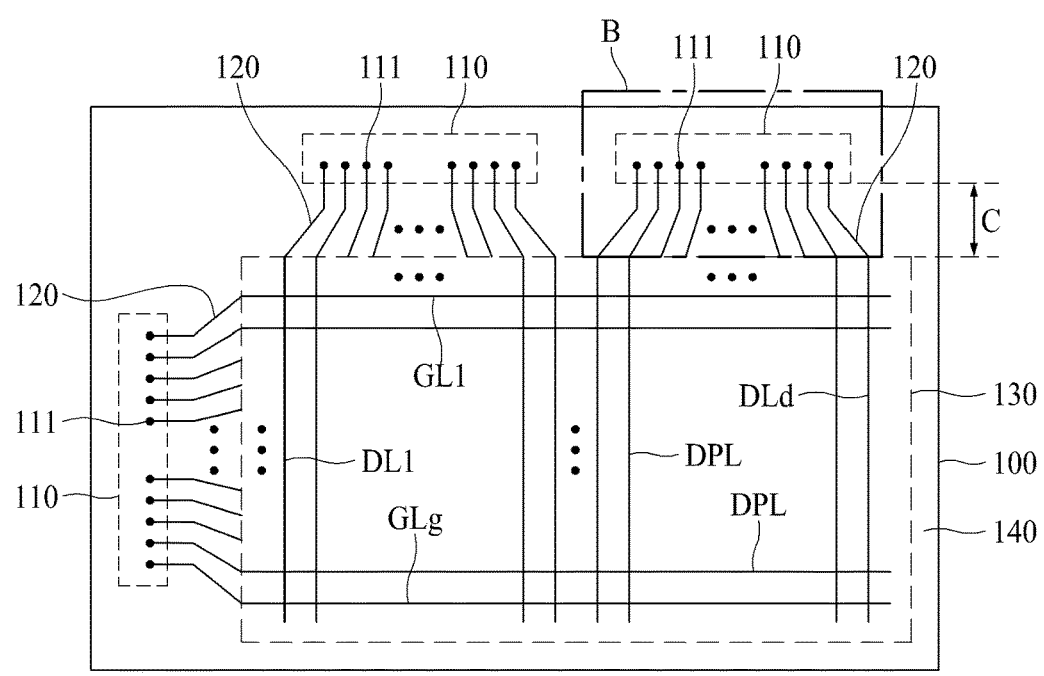
FIG. 2 is an exemplary diagram illustrating a display device according to an aspect of the present disclosure.
Figure 3:
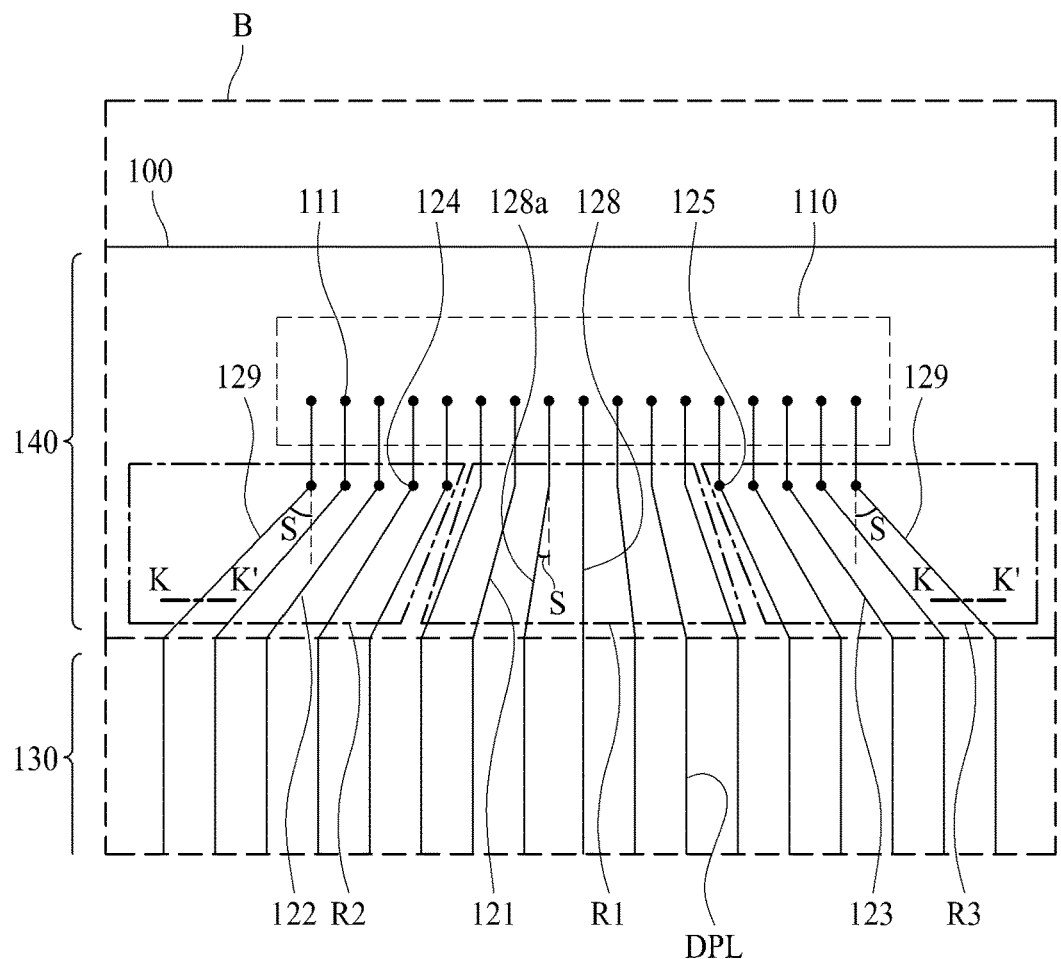
FIG. 3 is an enlarged diagram of an area B illustrated in FIG. 2.

FIG. 2 is an exemplary diagram illustrating a display device 100 according to an aspect of the present disclosure, and FIG. 3 is an enlarged diagram of an area B illustrated in FIG. 2.

The display device 100 according to an aspect of the present disclosure, as illustrated in FIGS. 2 and 3, may include a display area 130, which a plurality of display area lines DPL through which a data voltage or a gate pulse is supplied are provided, and a non-display area 140 which is provided outside the display area 130 surrounding the display area 130.

A pad part 110, including a plurality of pads 111 connected to a driving driver that supplies the data voltage or the gate pulse, may be provided in the non-display area 140.

A plurality of non-display area lines 120 connecting the pads 111 to the display area lines DPL may be provided in the non-display area 140.

First, the display panel 100 may be configured with a liquid crystal display panel or an organic light emitting display panel, and may be configured with various kinds of panels in addition to the liquid crystal display panel and the organic light emitting display panel.

The display area 130 may be an area, displaying an image, of the display panel 100. The display area 130 may include a plurality of data lines DL1 to DLd, through which data voltages are supplied, and a plurality of gate lines GL1 to Glg through which the gate pulse is supplied.

The display area lines DLP may be the data lines or the gate lines.

Moreover, the driving driver may be a data driver, a gate driver, or a driver which performs all of functions of the data driver and the gate driver.

For example, if the driving driver is the data driver which supplies the data voltages to the data lines DL1 to DLd, the display area lines DLP may be the data lines DL1 to DLd.

If the driving driver is the gate driver which supplies the gate pulse to the gate lines GL1 to GLg, the display area lines DLP may be the gate lines GL1 to GLg.

If the driving driver performs all of the functions of the data driver and the gate driver, the display area lines DLP may be the gate lines GL1 to GLg and the data lines DL1 to DLd.

The non-display area 140 may denote an area which is provided outside the display area 130 surrounding the display area 130.

If the display panel 100 has a tetragonal shape as illustrated in FIG. 2, the non-display area 140 may be provided on four sides of the display panel 100.

The non-display area 140 may include the pad part 110 including the pads 111 connected to the driving driver which supplies the data voltage or the gate pulse.

The non-display area lines 120 connecting the pads 111 to the non-display area lines DPL may be provided in the non-display area 140.

At least one driving driver may be equipped in the display panel 100. To this end, at least one pad part 110 may be provided in the non-display area 140. In FIG. 2, as an example of the present disclosure, a display panel including the three pad parts 110 is illustrated in order for three driving drivers to be equipped.

In this case, two driving drivers (i.e., the two pad parts 110 equipped with two data drivers) which supply the data voltages to the data lines DL1 to DLd may be provided in the non-display area 140 disposed on an upper end of the display panel 100.

Moreover, one driving driver (i.e., one pad part 110 equipped with one gate driver) that supplies the gate pulse to the gate lines GL1 to GLg may be provided in the non-display area 140 disposed on the left of the display panel 100.

The three pad parts 110 and the non-display area lines 120 connected to the three pad parts 110 may have the same configuration and function. Hereinafter, therefore, the display panel and the display device according to an aspect of the present disclosure will be described with reference to the pad part 110 and the non-display area lines 120 provided in the area B of FIG. 2.

Therefore, the below-described non-display area lines 120 may be provided in the non-display area 140 and may perform a function of connecting the data lines and the data driver equipped in the pad part 110. Also, the display area lines DPL may be the data lines.

First, an inclined angle S of each of the non-display area lines 120 may increase in a direction from the center non-display area line 128, disposed in the center of the pad part, of the non-display area lines 120 to an outer side.

For example, in FIG. 3, an inclined angle S of a non-display area line 129, disposed in an outer side, of the non-display area lines 120 may be greater than an inclined angle S of a non-display area line 128a adjacent to the center non-display area line 128.

Here, the inclined angle S may denote an angle between the center non-display area line 128 and the non-display area line 120. When the non-display area lines 128 except for the center non-display area line 128 include an inclined area and an area parallel to the center non-display area line 128 as illustrated in FIG. 3, the inclined angle S may denote an angle between the inclined area and the center non-display area line 128.

The center non-display area line 128 may be one of the non-display area lines 120. In order to differentiate the center non-display area line 128 from the other non-display area lines 120, the center non-display area line 128 is referred to by reference numeral "128". Also, in the following description, if necessary for differentiation from other non-display area lines, the non-display area line may be referred to by reference numeral in addition to reference numerals "120, 128, 128a, and 129".

Second, the non-display area lines 120 may include a plurality of first lines 121 provided in a first area R1 including the center non-display area line 128, a plurality of second lines 122 arranged outside one side of each of the first lines 121, and a plurality of third lines 123 arranged outside the other side of each of the first lines 121.

The first lines 121 may be provided in the first area R1 as described above.

In FIG. 3, for example, the second lines 122 may be provided in a second area R2 provided on the left of the first area R1.

In FIG. 3, for example, the third lines 123 may be provided in a third area R3 provided on the right of the first area R1.

The second lines 122 provided in the second area R2 may each include a first electrode and a second electrode which are electrically connected to each other with an insulation layer therebetween.

The third lines 123 provided in the third area R3 may each include a third electrode and a fourth electrode which are electrically connected to each other with an insulation layer therebetween.

To provide an additional description, the second lines 122 provided in the second area R2 and the third lines 123 provided in the third area R3 may each include two metal lines which are electrically connected to each other with an insulation layer therebetween. Therefore, a resistance of each of the second lines 122 and the third lines 123 is lower than that of each of a related art non-display area lines each including one metal line.

Therefore, a link height C which is an interval between the pad part 110 connected to the driving driver and the display area 130 illustrated in FIG. 2 may be less than a link height A illustrated in FIG. 1. Accordingly, a width of a bezel of the display panel according to an aspect of the present disclosure is reduced in comparison with a width of a bezel of the related art display panel.

The first to fourth electrodes will be described below with reference to FIGS. 4 to 6.

Figure 4:
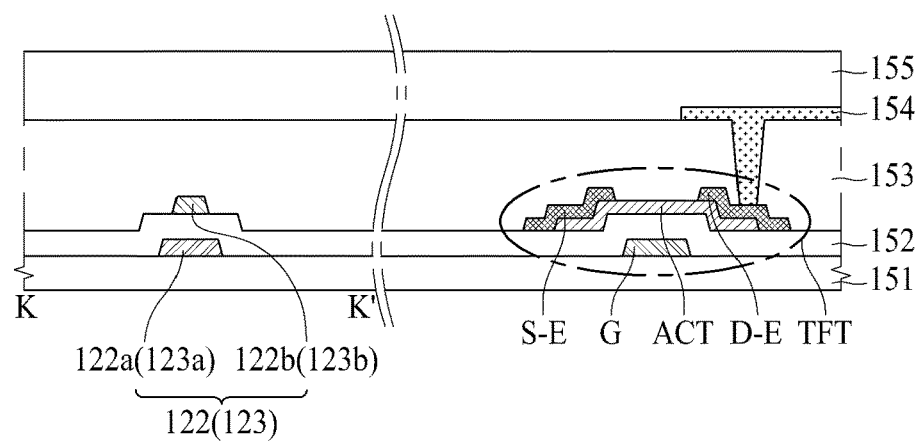
FIG. 4 is an exemplary diagram illustrating a cross-sectional view taken along a portion of each of a non-display area and a display area of a display panel according to an aspect of the present disclosure.

FIG. 4 is an exemplary diagram illustrating a cross-sectional view taken along a portion of each of a non-display area and a display area of a display panel according to an aspect of the present disclosure. Particularly, FIG. 4 is an exemplary diagram illustrating a cross-sectional view of each of an area, including a thin film transistor TFT, of the display area 130 and an area, including the second line 122 or the third line 123, of the non-display area 140. Here, a cross-sectional view of the second line 122 or the third line 123 denotes a cross-sectional view taken along line K-K' of FIG. 3.

The second line 122 and the third line 123 may be provided in the same structure. Therefore, in FIG. 4, a first electrode of the second line 122 referred to by 122a may be a third electrode 123a of the third line 123. Also, in FIG. 4, a second electrode of the second line 122 referred to by 122b may be a fourth electrode 123b of the third line 123. Also, in FIG. 4, a second line referred to by 122 may be the third line 123.

Various types of TFTs may be provided in the display area 130 or the non-display area 140 of the display panel 100. For example, TFTs for driving each of a plurality of pixels may be provided in the display area 130, and a thin film transistor TFT configuring the driving driver may be provided in the non-display area 140. Particularly, the gate driver which is to the driving driver may be configured in a gate-in panel (GIP) type which is built into the non-display area 140, and various types of TFTs may be included in the gate driver having the GIP type.

The display panel 100, as illustrated in FIG. 4, may include a substrate 151, a gate G which is provided on the substrate 151 and configures a thin film transistor TFT, a gate insulation layer 152 which covers the gate G and the substrate 151, an active layer ACT which is provided on the gate insulation layer 152, a first terminal S_E which is provided on one side of the active layer ACT, a second terminal D_E which is provided on the other side of the active layer ACT, a first insulation layer 153 which covers the first terminal, the second terminal, and the active layer, a first metal 154 which is provided on the first insulation layer 153 and connected to the second terminal D_E, and a first material 155 which covers the first metal 154.

When the display panel 100 is a liquid crystal display panel, the first metal 154 may be a transparent electrode, and the first material 155 may be a liquid crystal.

When the display panel 100 is an organic light emitting display panel, the first metal 154 may be an anode of an organic light emitting diode (OLED), and the first material 155 may be the OLED.

In the display panel 100, as illustrated in FIG. 4, the first electrode 122a of the second line 122 and the third electrode 123a of the third line 123 may be provided on the same layer as a metal line connected to the gate G of the thin film transistor TFT provided in the non-display area 140.

In the display panel 100, the second electrode 122b of the second line 122 and the fourth electrode 123b of the third line 123 may be provided on the same layer as a metal line connected to a source or a drain of the thin film transistor TFT. Here, the source or the drain of the thin film transistor TFT may be the first terminal S_E or the second terminal D_E.

To provide an additional description, the first electrode 122a of the second line 122 may be provided on a layer on which the gate G is provided, and the second electrode 122b may be provided on a layer, on which the first terminal S_E or the second terminal D_E is provided, or the same layer as the metal line connected to the first terminal S_E or the second terminal D_E. In this case, the first electrode 122a and the second electrode 122b may be disposed with the gate insulation layer 152 therebetween and may be electrically connected to each other through a first contact hole 124 which is provided in the gate insulation layer 152.

Moreover, the third electrode 123a of the third line 123 may be provided on a layer on which the gate G is provided, and the fourth electrode 123b may be provided on a layer, on which the first terminal S_E or the second terminal D_E is provided, or the same layer as the metal line connected to the first terminal S_E or the second terminal D_E. In this case, the third electrode 123a and the fourth electrode 123b may be disposed with the gate insulation layer 152 therebetween and may be electrically connected to each other through a second contact hole 125 which is provided in the gate insulation layer 152.

Figure 5:
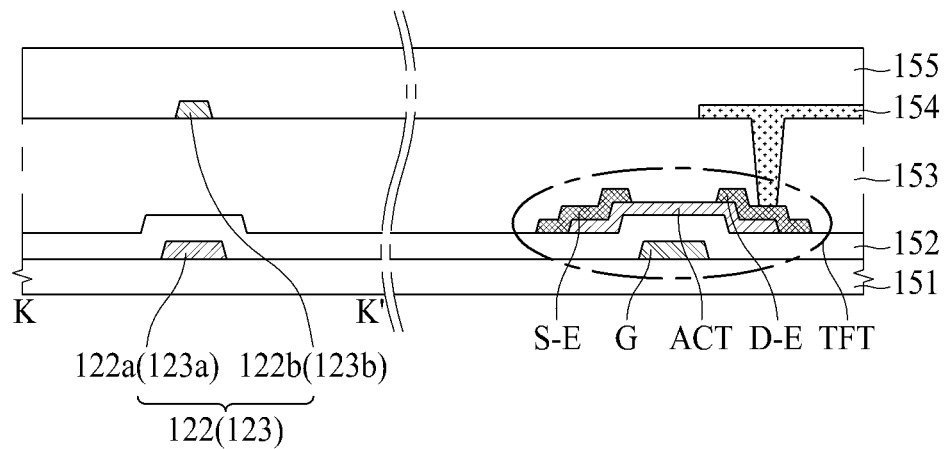
FIG. 5 is another exemplary diagram illustrating a cross-sectional view taken along a portion of each of a non-display area and a display area of a display panel according to an aspect of the present disclosure.

FIG. 5 is another exemplary diagram illustrating a cross-sectional view taken along a portion of each of a non-display area and a display area of a display panel according to an aspect of the present disclosure. Particularly, FIG. 5 is an exemplary diagram illustrating a cross-sectional view of each of an area, including a thin film transistor TFT, of the display area 130 and an area, including the second line 122 or the third line 123, of the non-display area 140. Here, a cross-sectional view of the second line 122 or the third line 123 denotes a cross-sectional view taken along line K-K' of FIG. 3. In the following description, details which are the same as or similar to the details described above with reference to FIG. 4 are omitted or will be briefly described.

In the display panel 100, as illustrated in FIG. 5, the first electrode 122a of the second line 122 and the third electrode 123a of the third line 123 may be provided on the same layer as a metal line connected to the thin film transistor TFT provided in the display area 130 or the non-display area 140. Here, the metal line connected to the thin film transistor TFT may be a metal line connected to the gate G, a metal line connected to the first terminal S_E, or a metal line connected to the second terminal D_E.

In the display panel 100, the second electrode 122b of the second line 122 and the fourth electrode 123b of the third line 123 may be provided on the same layer as a transparent electrode provided in the display area 130. For example, as illustrated in FIG. 4, when the display panel 100 is a liquid crystal display panel, the first metal 154 may be a transparent electrode. In this case, the second electrode 122b and the fourth electrode 123b may be provided on the same layer as the transparent electrode, and moreover, may each be formed of a transparent electrode.

Moreover, when the display panel 100 is an organic light emitting display panel, the first metal 154 may be an anode. In this case, the second electrode 122b and the fourth electrode 123b may be provided on the same layer as the anode, and moreover, may each be formed of metal which is the same as that of the anode.

Figure 6:
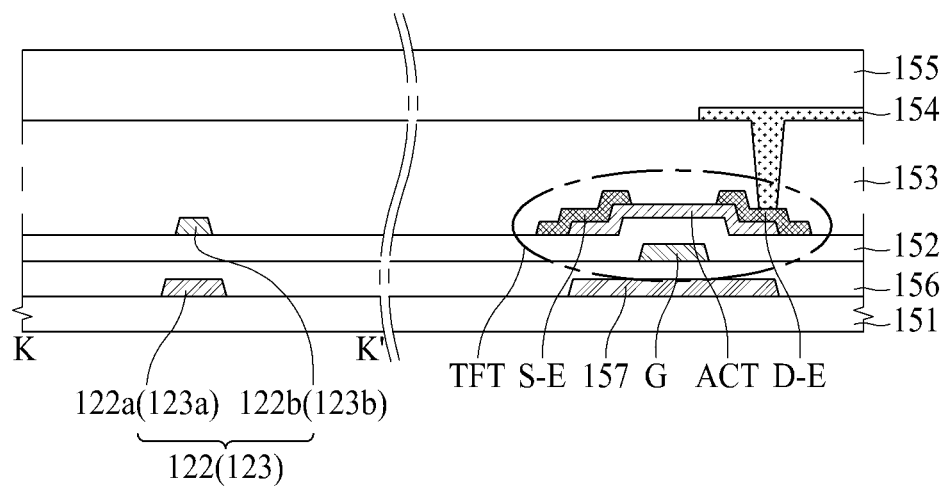
FIG. 6 is another exemplary diagram illustrating a cross-sectional surface taken along a portion of each of a non-display area and a display area of a display panel according to an aspect of the present disclosure.

FIG. 6 is another exemplary diagram illustrating a cross-sectional view taken along a portion of each of a non-display area and a display area of a display panel according to an aspect of the present disclosure. Particularly, FIG. 6 is an exemplary diagram illustrating a cross-sectional view of each of an area, including a thin film transistor TFT, of the display area 130 and an area, including the second line 122 or the third line 123, of the non-display area 140. Here, a cross-sectional view of the second line 122 or the third line 123 denotes a cross-sectional view taken along line K-K' of FIG. 3. In the following description, details which are the same as or similar to the details described above with reference to FIGS. 4 and 5 are omitted or will be briefly described.

In the display panel 100, as illustrated in FIG. 6, the first electrode 122a of the second line 122 and the third electrode 123a of the third line 123 may be provided on the same layer as a light shield 157 covering an active area ACT of the thin film transistor TFT provided in the display area 130 or the non-display area 140. The light shield 157 may cover the active area ACT, for preventing a characteristic of the active area ACT from being affected by light or a parasitic capacitance. The light shield 157 may be provided on the substrate 151, and a second insulation layer 156 may be provided between the light shield 157 and the gate G.

In the display panel 100, the second electrode 122b of the second line 122 and the fourth electrode 123b of the third line 123 may be provided on the same layer as a metal line connected to the thin film transistor TFT. Here, the metal line connected to the thin film transistor TFT may be a metal line connected to the gate G, a metal line connected to the first terminal S_E, or a metal line connected to the second terminal D_E. In FIG. 6, a display panel where the second electrode 122b and the fourth electrode 123b are provided on a layer on which a metal line connected to the first terminal S_E or the second terminal D_E is disposed is illustrated.

Figure 7:
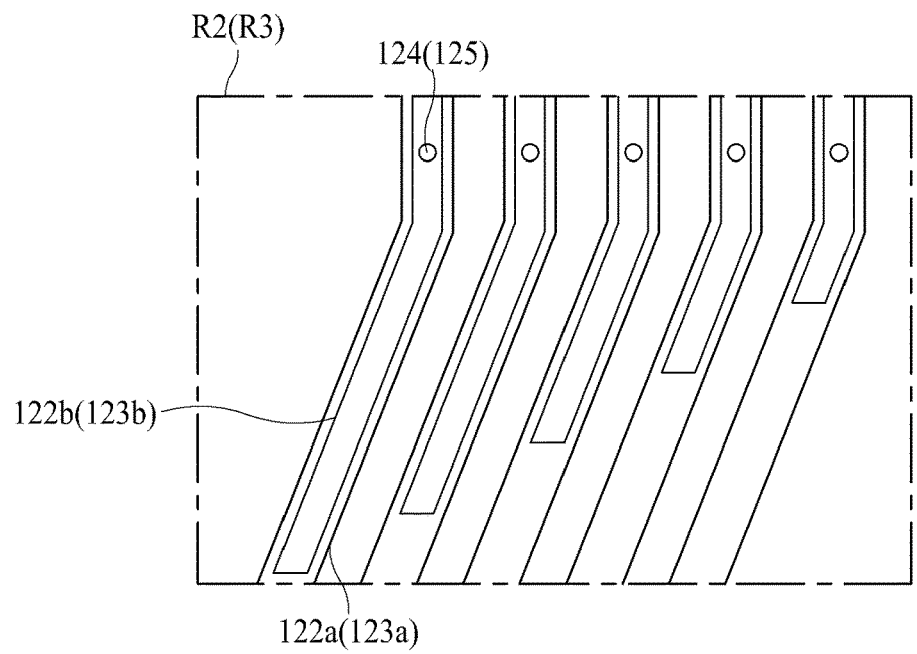
FIG. 7 is an exemplary diagram illustrating a plurality of non-display area lines included in a display panel according to an aspect of the present disclosure.

FIG. 7 is an exemplary diagram illustrating a plurality of non-display area lines included in a display panel according to an aspect of the present disclosure, and particularly, is an exemplary diagram illustrating the second lines 122 and the third lines 123.

To provide an additional description, FIG. 7 is an exemplary diagram illustrating the second lines 122 provided in the second area R2. The third lines 123 provided in the third area R3 may have the same structure as that of the second lines 122 provided in the second area R2 and may have a structure which is laterally symmetric with the second lines 122.

Therefore, in FIG. 7, a first electrode of the second line 122 referred to by 122a may be a third electrode 123a of the third line 123. Also, in FIG. 7, a second electrode of the second line 122 referred to by 122b may be a fourth electrode 123b of the third line 123. Also, in FIG. 4, the second line referred to by 122 may be the third line 123. Also, as described above, the second lines 122 and the third lines 123 may have a laterally symmetric structure. Therefore, in FIG. 7, the third lines 123 may substantially have a structure where a left side and a right side have switched therebetween.

In the display panel 100, the first electrode 122a of the second line 122 may be physically connected to the display area line DPL, and the second electrode 122b of the second line 122 may be electrically connected to the first electrode 122a through a first contact hole 124 of an insulation layer provided between the first electrode 122a and the second electrode 122b.

Here, in the display panel 100 illustrated in FIG. 4, the insulation layer may be the gate insulation layer 152. Also, in the display panel 100 illustrated in FIG. 5, the insulation layer may be the gate insulation layer 152 and the first insulation layer 153. Also, in the display panel 100 illustrated in FIG. 6, the insulation layer may be the gate insulation layer 152 and the second insulation layer 156.

In the display panel 100, the third electrode 123a of the third line 123 may be physically connected to the display area line DPL, and the fourth electrode 123b of the third line 123 may be electrically connected to the third electrode 123a through a second contact hole 125 of the insulation layer provided between the third electrode 123a and the fourth electrode 123b.

Here, in the display panel 100 illustrated in FIG. 4, the insulation layer may be the gate insulation layer 152. Also, in the display panel 100 illustrated in FIG. 5, the insulation layer may be the gate insulation layer 152 and the first insulation layer 153. Also, in the display panel 100 illustrated in FIG. 6, the insulation layer may be the gate insulation layer 152 and the second insulation layer 156.

In this case, as illustrated in FIG. 3, a length of each of the second electrodes 122b configuring the second lines 122 may be shortened in a direction from an outer side of the pad part 110 to the center non-display area line 128. When the length of each of the second electrodes 122b is shortened, a resistance of each of the second lines 122 may progressively increase.

To provide an additional description, the resistance of each of the second lines 122 may be reduced by using the second electrodes 122b, and thus, the link height C may decrease. Also, in order to linearly increase or decrease a resistance deviation between the second lines 122 as much as possible, the lengths and shapes of the second electrodes 122b may be variously changed.

Moreover, a length of each of the fourth electrodes 123b configuring the third lines 123 may be shortened in the direction from the outer side of the pad part 110 to the center non-display area line 128.

To provide an additional description, the resistance of each of the third lines 123 may be reduced by using the fourth electrodes 123b, and thus, the link height C may decrease. Also, in order to linearly increase or decrease a resistance deviation between the third lines 123 as much as possible, the lengths and shapes of the fourth electrodes 123b may be variously changed.

Figure 8:
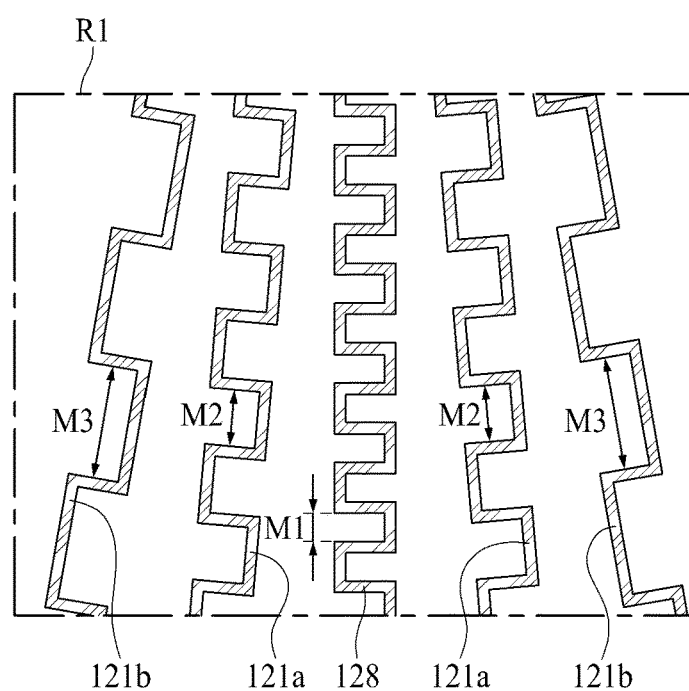
FIG. 8 is an exemplary diagram illustrating a plurality of non-display area lines provided in a first area of a display panel according to an aspect of the present disclosure.

FIG. 8 is an exemplary diagram illustrating a plurality of non-display area lines provided in a first area of a display panel according to an aspect of the present disclosure.

An inclined angle of each of the first lines 121 provided in the first area R1 may be less than that of each of the second lines 122 and the third lines 123 respectively provided in the second area R2 and the third area R3, and thus, a length of each of the first lines 121 may be shorter than that of each of the second lines 122 and the third lines 123. Accordingly, a resistance of each of the first lines 121 may be lower than that of each of the second lines 122 and the third lines 123.

In order to prevent such a deviation, as described above, each of the second lines 122 and the third lines 123 may be configured with two lines. Also, each of the second lines 122 and the third lines 123 may be configured with three or more lines.

However, since the length of each of the first lines 121 is far shorter than that of each of the second lines 122 and the third lines 123, a resistance deviation between the first lines 121, the second lines 122, and the third lines 123 is not largely reduced despite using the above-described method.

In order to prevent such a problem, as illustrated in FIG. 8, the first lines 121 may be provided in a zigzag pattern, and thus, a resistance deviation between the first lines 121, the second lines 122, and the third lines 123 is reduced.

In this case, as illustrated in FIG. 8, a pattern interval between zigzag patterns is reduced progressively closer to the center non-display area line 121.

For example, in FIG. 8, a pattern interval M2 of the center non-display area line 121 may be set shorter than a pattern interval of the other first lines 121 provided in the first area R1.

Moreover, a pattern interval M2 of first lines 121a adjacent to the left and the right of the center non-display area line 121 may be set less than a pattern interval M3 of the other first lines 121b farther away from the center non-display area line 121.

Figure 9:
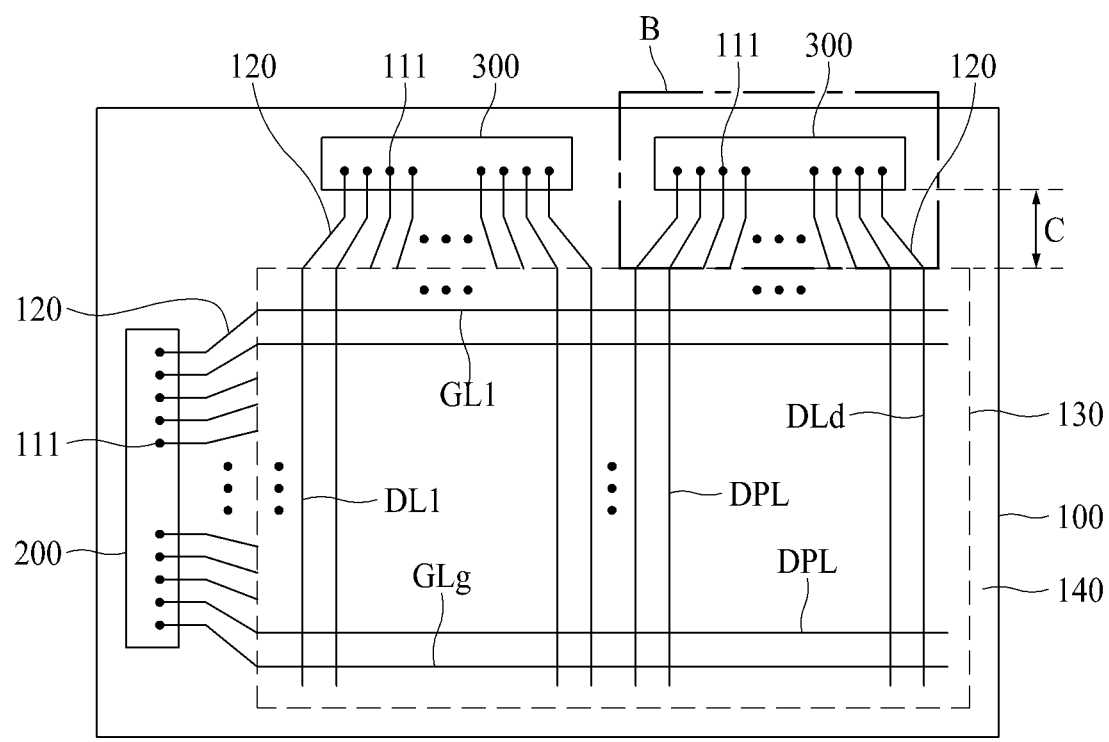
FIG. 9 is an exemplary diagram illustrating a configuration of a display device according to an aspect of the present disclosure.

FIG. 9 is an exemplary diagram illustrating a configuration of a display device according to an aspect of the present disclosure. In the following description, details which are the same as or similar to the details described above with reference to FIGS. 2 to 8 are omitted or will be briefly described.

The display device according to an aspect of the present disclosure may include a display panel 100, which includes a plurality of display area lines DPL and displays an image, and a driving driver that supplies a data voltage or a gate pulse to the display area lines DPL.

First, the display panel 100 may use the display panel described above with reference to FIGS. 2 to 8.

Therefore, the display panel 100 may include a display area 130, which the plurality of display area lines DPL are provided, and a non-display area 140 which is provided outside the display area 130 to surround the display area 130.

A pad part 110, including a plurality of pads 111 connected to the driving driver, may be provided in the non-display area 140.

A plurality of non-display area lines 120 connecting the pads 111 to the display area lines DPL may be provided in the non-display area 140.

An inclined angle S of each of the non-display area lines 120 may increase in a direction from a center non-display area line 128, disposed in a center of the pad part 110, of the non-display area lines 120 to an outer side.

The non-display area lines 120 may include a plurality of first lines 121 provided in a first area R1 including the center non-display area line 128, a plurality of second lines 122 arranged outside one side of each of the first lines 121, and a plurality of third lines 123 arranged outside the other side of each of the first lines 121.

The second lines 122 may each include a first electrode 122a and a second electrode 122b which are electrically connected to each other with an insulation layer therebetween.

The third lines 123 may each include a third electrode 123a and a fourth electrode 124b which are electrically connected to each other with an insulation layer therebetween.

Second, the driving driver may be one of a gate driver 200, a data driver 300, and a driver which performs functions of the gate driver 200 and the data driver 300.

For example, in FIG. 9, a display device where three driving drivers are mounted on the three pad parts 110 is illustrated as an example of the present disclosure.

In this case, the two data drivers 300 which supply data voltages to data lines DL1 to DLd may be respectively mounted on the two pad parts 110 provided in the non-display area 140 disposed on an upper end of the display panel 100.

Moreover, one driving driver 200 that supplies a gate pulse to gate lines GL1 to GLg may be mounted on the pad part 110 provided in the non-display area 140 disposed on the left of the display panel 100.

The above-described display device according to an aspect of the present disclosure will be briefly described below.

In an aspect of the present disclosure, in order to minimize a resistance deviation between the non-display area lines 120, the second lines 122 and the third lines 123 arranged in an outer side among the non-display area lines 120 may each be configured with two electrode lines which are spaced apart from each other with an insulation layer therebetween.

Moreover, in order to more decrease the resistance deviation, the first lines 121 arranged in a center among the non-display area lines 120 may be provided in a zigzag pattern.

As described above, according to the aspects of the present disclosure, a resistance deviation of non-display area lines connected to one driving driver is reduced, thereby decreasing smears caused by the resistance deviation of the non-display area line2.

Moreover, according to the aspects of the present disclosure, resistances of non-display area lines provided in an outer side among the plurality of non-display area lines are further reduced than the related art, and thus, a link height which is an interval between the driving driver and the display area is reduced. Accordingly, a width of the bezel of the display panel is reduced.

Moreover, according to the aspects of the present disclosure, resistances of the non-display area lines decrease, and thus, despite the number of the driving drivers being reduced, smears caused by a resistance deviation of the non-display area lines are reduced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display panel comprising a display area and a non-display area, wherein the display area includes a plurality of display area lines through which at least one of a data voltage and a gate pulse is supplied and the non-display area is disposed outside and surrounds the display area, comprising:
    a pad part comprising a plurality of pads connected to a driving driver that supplies the at least one of the data voltage and the gate pulse and disposed in the non-display area; and
    a plurality of non-display area lines connecting the plurality of pads to the plurality of display area lines and disposed in the non-display area, wherein the plurality of non-display area lines have an inclined angle increasing to a direction from a center non-display area line having a non-inclined angle to an outer side, each non-display area line comprises,
    a plurality of first lines provided in a first area including the center non-display area line,
    a plurality of second lines arranged outside one side of each of the plurality of first lines, and
    a plurality of third lines arranged outside another side of each of the plurality of first lines,
    wherein each of the plurality of second lines comprises a first electrode and a second electrode electrically connected to each other with an insulation layer therebetween, and each of the plurality of third lines comprises a third electrode and a fourth electrode electrically connected to each other with an insulation layer therebetween,
    wherein the second electrode has a length shortened to a direction from an outer side of the pad part to the center non-display area line and the fourth electrode has a length shortened to a direction from an outer side of the pad part to the center non-display area line, and
    wherein the second electrode has a length shorter than the first electrode and the fourth electrode has a length shorter than the third electrode.

2. The display panel of claim 1, wherein the first and third electrodes are disposed on the same layer as a metal line connected to a gate of a thin film transistor, and the second and fourth electrodes are disposed on the same layer as a metal line connected to one of a source and a drain of the thin film transistor.

3. The display panel of claim 1, wherein the first electrode is directly connected to the display area lines, and the second electrode is electrically connected to the first electrode through a first contact hole of an insulation layer between the first and second electrodes.

4. The display panel of claim 3, wherein the third electrode is directly connected to the display area lines, and the fourth electrode is electrically connected to the third electrode through a second contact hole of the insulation layer between the third and fourth electrodes.

5. The display panel of claim 4, wherein the fourth electrode has a length shortened to a direction from an outer side of the pad part to the center non-display area line.

6. The display panel of claim 3, wherein the second electrode has a length shortened to a direction from an outer side of the pad part to the center non-display area line.

7. The display panel of claim 1, wherein the plurality of first lines each has a zigzag pattern.

8. The display panel of claim 7, wherein the zigzag pattern has a pattern interval between adjacent zigzag patterns reduced progressively closer to the center non-display area line.

* * * * *